(12) United States Patent
Konishi et al.

(10) Patent No.: US 6,391,113 B1
(45) Date of Patent: *May 21, 2002

(54) SEMICONDUCTOR WAFER PROCESSING APPARATUS AND METHOD OF CONTROLLING THE SAME

(75) Inventors: Toko Konishi; Naoki Yokoi, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,701

(22) Filed: Jun. 2, 1998

(30) Foreign Application Priority Data

Dec. 8, 1997 (JP) ............................................. 9-336773

(51) Int. Cl.$^7$ .......................... C23C 16/00; H05H 1/00; H01L 21/00
(52) U.S. Cl. ....................... 118/719; 118/500; 156/345; 438/689
(58) Field of Search ............................... 134/73–76, 18, 134/26, 32, 42, 84; 156/345 L, 345 LC; 216/91; 414/935–938; 118/429, 500; 250/559.46, 559.47

(56) References Cited

U.S. PATENT DOCUMENTS

| | | | | |
|---|---|---|---|---|
| 4,859,993 A | * | 8/1989 | Kagami et al. | 340/674 |
| 4,952,115 A | * | 8/1990 | Ohkase | 414/618 |
| 5,370,142 A | * | 12/1994 | Nishi et al. | 134/61 |
| 5,406,092 A | * | 4/1995 | Mokuo | 250/559.4 |
| 5,524,131 A | * | 6/1996 | Uzawa et al. | 378/34 |
| 5,824,119 A | * | 10/1998 | Takeuchi | 29/25.01 |

FOREIGN PATENT DOCUMENTS

| | | | | |
|---|---|---|---|---|
| JP | 1-144647 A | * | 6/1989 | ........... H01L/21/68 |
| JP | 3-237739 | | 10/1991 | |
| JP | 5-152423 | | 6/1993 | |
| JP | 6-132269 | | 5/1994 | |
| JP | 6-151401 | | 5/1994 | |

* cited by examiner

*Primary Examiner*—Gregory Mills
*Assistant Examiner*—P. Hassanzadeh
(74) *Attorney, Agent, or Firm*—McDermott, Will & Emery (57) ABSTRACT

Semiconductor wafer counters are respectively provided at a loader portion, at a plurality of processing baths and at an unloader portion in a semiconductor wafer processing apparatus in which semiconductor wafers are processed in sequence using a plurality of processing baths, and when missing of wafers is detected, an alarm is issued. Also, there is provided an interlock function which stops processing in a processing bath in which the missing is detected and allows processing in downstream processing baths to continue, but prevents additional lots from being introduced into the loader portion and stops processing in upstream processing baths after the completion of the chemical processing under way.

19 Claims, 5 Drawing Sheets

Loader Portion → Unloader Portion

SEMICONDUCTOR WAFER PROCESSING APPARATUS AND METHOD OF CONTROLLING THE SAME

BACKGROUND OF THE INVENTION

1. Field of the Invention

The present invention relates to an apparatus and a method for controlling a semiconductor wafer processing in a semiconductor manufacturing line. More particularly, the present invention relates to a processing apparatus and a control method thereof which performs treatments such as a chemical processing, a cleaning processing and a drying processing on a multibath and batch/dip type bath line for processing semiconductor wafers.

2. Background Art

A single line of multibath and batch/dip type bath for processing semiconductor wafers is employed to perform a continuous processing of semiconductor wafers with many kinds of chemicals, allowing a processing in a plurality of batches to be performed simultaneously. In a mass-production factory, batches are introduced by a tact, and usually several batches are simultaneously processed by a single line of multibath and batch/dip type bath apparatus.

Also, in the case of such a multibath and batch/dip type bath apparatus, a wafer counter is provided at a lot introducing portion (a loader portion) and a lot retrieving portion (an unloader portion) in order to detect missing or breakage of the wafers. This makes it possible to judge that missing or breakage of the wafers, when the counted number differs between an introducing time and a retrieving time.

In a conventional processing apparatus, when several batches are being processed, and if breakage or missing of the wafers happens in any of the batches lead to a trouble, the breakage or missing of the wafers may not been detected until the troubled lot is retrieved at the lot retrieving portion. The following batches, by that time, enters a bath in which the trouble had occurred, and will be secondary-contaminated by causes such as the fragments produced. In addition to this, in the case of a trouble in a transportation system, an identical trouble is expected to spread over the following lots, thus extending the damages even further.

SUMMARY OF THE INVENTION

The present invention has been made in order to solve the above-mentioned problems in the conventional art, and thus an object of the present invention is to rapidly or instantaneously detect troubles arising from missing or breakage of the wafers in a multibath and batch/dip type semiconductor wafer processing apparatus. Also, another object of the invention is to provide a processing apparatus which makes it possible to prevent the secondary damages from extending over the following lots by setting an interlock for the following lots in correspondence to the detection result.

According to one aspect of the present invention, a semiconductor wafer processing apparatus includes a plurality of processing baths for processing semiconductor wafers in sequence on a batch-processing basis, a loader portion for introducing the semiconductor wafers into a first processing bath, and an unloader portion for retrieving the semiconductor wafers from a final processing bath. Further, the processing apparatus comprises an introduced wafer counter for counting the number of the semiconductor wafers introduced from the loader portion. Also provided are a plurality of passing wafer counters for counting the number of the semiconductor wafers passing through a predetermined number of the processing baths selected from the plurality of processing baths. Further, provided is a retrieved wafer counter for counting the number of the semiconductor wafers retrieving from the unloader portion.

In the semiconductor wafer processing apparatus, the introduced wafer counter is provided at the loader portion, and the passing wafer counters are preferably provided between the plurality of passing baths, and the retrieved wafer counter is provided at the unloader portion.

Alternatively, in the semiconductor wafer processing apparatus, the passing wafer counters are provided preferably inside the selected processing baths.

In another aspect of the present invention, the semiconductor wafer processing apparatus further comprises an alarming means which issues an alarm when the number of the wafers detected by the passing wafer counters or by the retrieved wafer counter differs from that of the number of the wafers detected by the introduced wafer counter.

The semiconductor wafer processing apparatus further comprises preferably an interlock means which, when any of the passing wafer counters issues an alarm, stops processing in the corresponding processing bath, and prevents additional lots from being introduced into the loader portion, and stops processing in upstream processing baths after completion of the chemical processing under way, and allows processing in downstream processing baths to continue.

Further, the interlock means preferably has an automatic reset function which, when a trouble in the processing bath which has issued the alarm is released, automatically continues processing of the following lots on standby.

According to another aspect of the present invention, in a method of controlling the semiconductor wafer processing apparatus, an alarm is issued when the number of the wafer detected by the passing wafer counters or by the retrieved wafer counter differs from the number of the wafers detected by the introduced wafer counter, and the processing is stopped in the corresponding processing bath. Additional lots are prevented from being introduced into the loader portion. Processing in upstream processing baths is stopped after the completion of the chemical processing under way, and processing in downstream processing baths is allowed to continue.

Further, in the method, processing of the following lots on standby is automatically continued when a trouble in the processing bath corresponding to the alarm is released.

Other and further objects, features and advantages of the invention will appear more fully from the following description.

BRIEF DESCRIPTION OF THE DRAWINGS

FIG. 1(a) and FIG. 1(b) are diagrams showing a constitution of a multibath and batch/dip type semiconductor wafer processing apparatus according to a first embodiment of the present invention.

FIG. 4(a) and FIG. 4(b) are diagrams showing a constitution of a multibath and batch/dip type semiconductor wafer processing apparatus according to a second embodiment of the present invention.

BEST MODE OF CARRYING OUT THE INVENTION

Figure 1A:
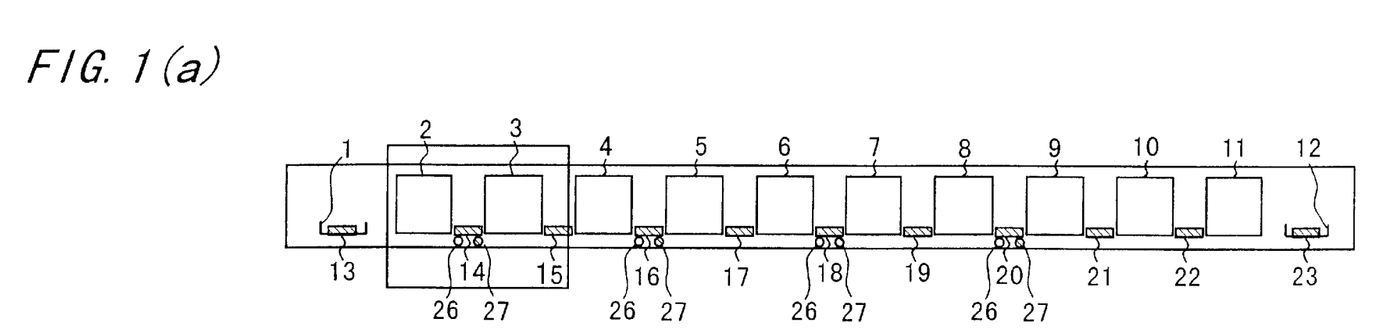
FIG. 1(a) is a diagram showing a state in which a plurality of processing baths are located.
Figure 1B:
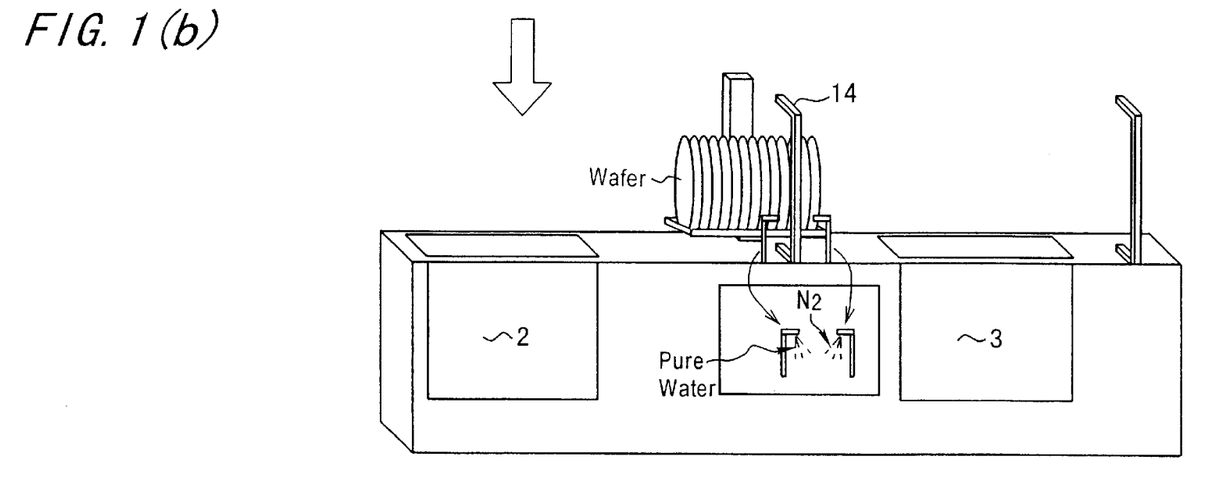
FIG. 1(b) is an enlarged perspective view showing a portion of the apparatus in FIG. 1(a).

This invention will be described in further detail by way of example with reference to the accompanying drawings.
First Embodiment FIG. 1(a) and FIG. 1(b) is a diagram showing a constitution of a multibath and batch/dip type semiconductor wafer processing apparatus according to a first embodiment of the present invention. FIG. 1(a) is a diagram showing a state in which a plurality of processing baths are located, and FIG. 1(b) is an enlarged perspective view showing a portion of the apparatus in FIG. 1(a).

In the semiconductor wafer processing apparatus in FIG. 1, reference numeral 1 designates a loader portion. Numerals 2 through 11 designate processing baths.. Among them, numerals 2, 4, 6, and 8 show a first, a second, a third and a fourth chemical processing baths, respectively, and numerals 3, 5, 7, 9, 10 show a first, a second, a third, a fourth and a fifth (final) water cleaning baths, and numeral 11 shows an IPA vapor drying bath. Also, numeral 12 designates an unloader portion.

Further, reference numerals 13 through 23 designate wafer counters two of which are provided at the loader portion 1 and the unloader portion 12, and the others of which are provided between each two of the processing baths 2 through 11. Among them, numeral 13 shows an introduced wafer counter for counting the number of semiconductor wafers introduced into the loader portion 1, and numerals 14 through 22 show passing wafer counters for counting the number of semiconductor wafers passing through each of the processing baths 2 through 10, and numeral 23 shows a retrieved wafer counter for counting the number of semiconductor wafers retrieved from the unloader portion 12.

Incidentally, the passing wafer counters can, as required, be located at spaces between baths selected from the processing baths. The selected baths, preferably, should be all of the processing baths as is the case with the first embodiment, but they may be some of the processing baths as required.

Figure 2:
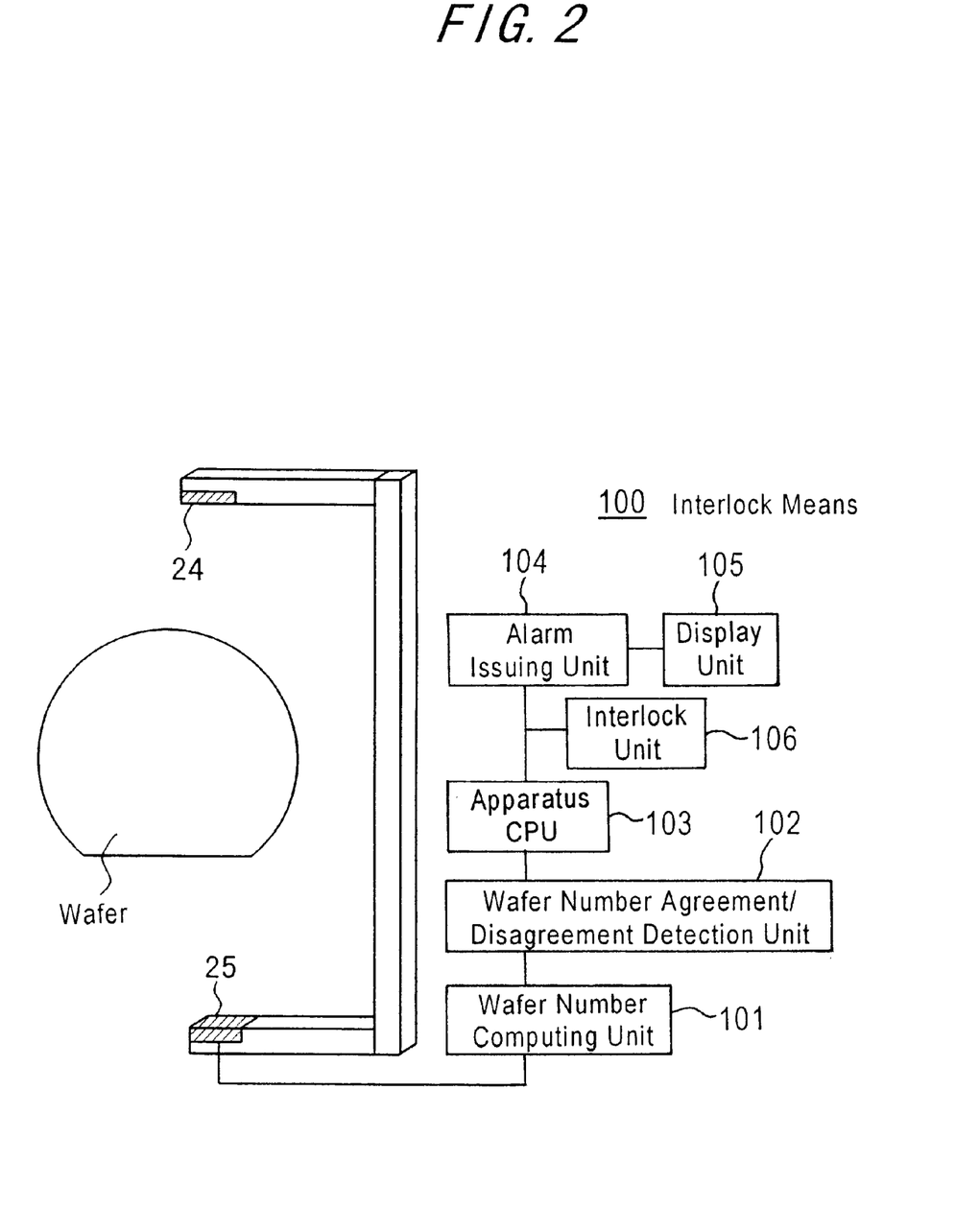
FIG. 2 is a diagram which shows a constitution of an alarm and interlock means as well as schematically shows a structure of the wafer counter in FIG. 1.

FIG. 2 is a diagram which shows a constitution of an alarm and interlock means as well as schematically shows a structure of the wafer counter in FIGS. 1(a)–1(b). In FIG. 2, numerals 24 and 25 designate a sensor light emitting part and a sensor light detecting part, respectively. Semiconductor wafers pass through between both parts facing each other, thereby making it possible to detect whether or not some wafers are missing.

Also, the passing wafer counters 14, 16, 18, and 20 are respectively provided between the first chemical bath 2 and the first water cleaning bath 3, between the second chemical bath 4 and the second water cleaning bath 5, between the third chemical bath 6 and the third water cleaning bath 7, and between the fourth chemical bath 8 and the fourth water cleaning bath 9. Namely, the baths before the passing wafer counters are chemical ones, which leads to a possibility that the chemicals are attached to the counters. Accordingly, as is shown in FIG. 1(b), there are provided a cleaning means 26 (a water cleaning means or a shower) for cleaning (water cleaning) after a batch has passed through, and a drying means 27 (nitrogen blow) for drying.

Figure 3A:
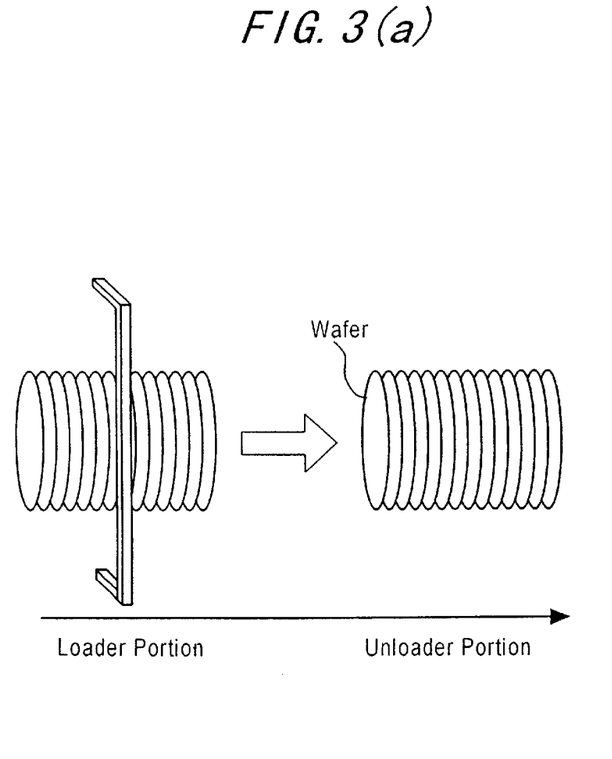
FIG. 3(a) is an enlarged diagram showing a transportation state of semiconductor wafers passing through the wafer counters in the processing apparatus in FIG. 1.

Next, FIG. 3(a) is an enlarged diagram showing a transportation state of semiconductor wafers passing through the wafer counters in the processing apparatus in FIG. 1(a) and FIG. 1(b). Batches of semiconductor wafers introduced into the loader portion 1 are transported in such a manner that the batches are arranged in sequence so that, as is shown in FIG. 3(a), planes of the semiconductor wafers are perpendicular to the transportation direction. During this transportation, when a batch of semiconductor wafers passes through a wafer counter, the wafer counter counts the number of the wafers from an external diameter direction of the semiconductor wafers. Concretely, this wafer counter is a vertical type. This makes it possible to count the number of the wafers without taking a time for counting the number.

Figure 3B:
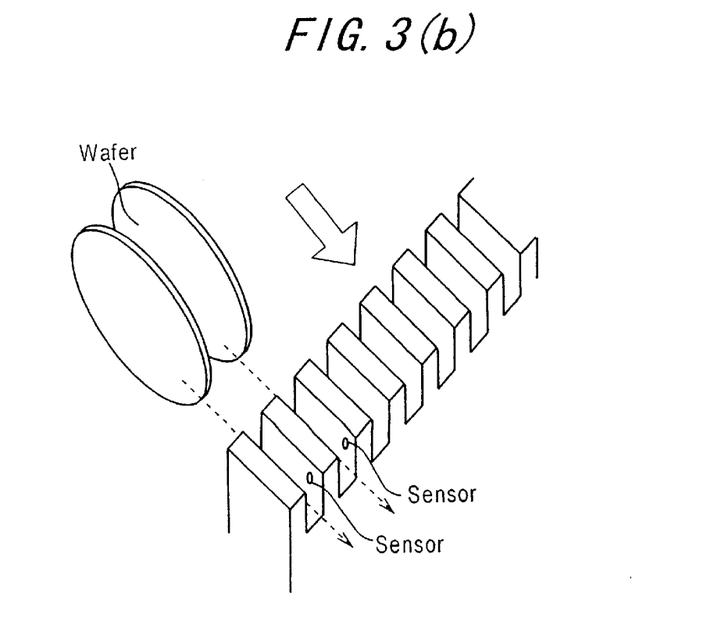
FIG. 3(b) is a diagram showing another structural example of the wafer counters and another example of a transportation state of semiconductor wafers.

In addition, FIG. 3(b) is a diagram showing another structural example of the wafer counters and another example of a transportation state of semiconductor wafers. Batches of semiconductor wafers introduced into the loader portion 1 are transported in such a manner that the batches are arranged in parallel to the transportation direction so that, as is shown in FIG. 3(b), planes of the semiconductor wafers are parallel to the transportation direction. During this transportation, when a batch of semiconductor wafers passes through a wafer counter, the wafer counter detects the semiconductor wafers and counts the number of the wafers from a plane direction of the semiconductor wafers. Concretely, this wafer counter is of a comb-shaped sensor type, and at a time when the semiconductor wafers pass through the comb-shaped slits, it detects whether or not some wafers are missing. This makes it possible to count the number of the wafers without taking a time for counting the number.

If, due to breakage or missing of the wafers, the number of wafers counted by any of the passing wafer counters 14 through 22 or by the retrieved wafer counter 23 differs from the number of wafers counted at the loader portion 1 at the batch introducing time, an alarm detection system issues an alarm instantaneously. At the same time the semiconductor wafer processing apparatus itself is interlocked, and the batch with the breakage or missing of the wafers is stopped immediately.

FIG. 2 shows a constitution of an alarm and interlock means 100 for issuing an alarm from the wafer counters 14 through 23 each of which is accompanied by the alarm and interlock means. In FIG. 2, reference numeral 101 designates a wafer number computing unit, numeral 102 a wafer number agreement/disagreement detection unit, numeral 103 a device CPU, numeral 104 an alarm issuing unit, numeral 105 a display unit, and numeral 106 an interlock unit.

Described as follows is the operation interlock means 100 shown in FIG. 2. The sensor in the wafer counter detects whether or not some semiconductor wafers are missing. The wafer number computing unit 101 counts the number of the wafers, and the wafer number agreement/disagreement detection unit 102 detects whether or not the number counted agrees with the number counted at the loader portion, thus outputting the detection result to the apparatus CPU 103. If the detection result turns out to be a disagreement, the apparatus CPU 103 outputs an alarm signal to the alarm issuing unit 104, and the display unit 105 displays this alarm signal. Furthermore, the apparatus CPU 103 outputs an interlock signal to the interlock unit 106.

Next, the content of the interlock will be described below. At a time when a trouble has occurred, the processing is stopped in a processing bath in which the trouble has occurred. In the processing baths in the downstream of the processing line in which the trouble occurred, the processings continue as usual. In other words, concerning the batches preceding the batch in which the trouble occurred (i.e. the batches at the side of the unloader portion 12), the processings are performed as usual and the processed batches are retrieved to the unloader portion 12. A batch in the drying bath 11, after being dried for a predetermined time, is pulled up from the drying bath 11, and is retrieved to the unloader portion 12.

Also, in the processing baths in the upstream of the processing line in which the trouble occurred, the processings are stopped after the chemical processings, which are now being performed, are finished. In more concrete words, concerning the batches following the place at which the trouble occurred (i.e. the batches at the side of the loader portion 1), the situation is as follows. The batch in the first chemical bath 2, after being dipped for a preferred time (that is, after the chemical processing is over as previously planned), is set to stand by while being water-cleaned in the first water cleaning bath 3. The batch in the second chemical bath 4, after being dipped for a preferred time, is set to stand by while being water-cleaned in the second water cleaning bath 5. The batch in the third chemical bath 6, after being dipped for a preferred time, is set to stand by while being water-cleaned in the third water cleaning bath 7. The batch in the fourth chemical bath 8, after being dipped for a preferred time, is set to stand by while being water-cleaned in the fourth water cleaning bath 9. In this way, any of the batches is set to stand by at a standby position before the place at which a trouble occurred.

Moreover, when any of the above-mentioned wafer counters issues an alarm, the interlock means 100 prevents a lot from being introduced into the loader portion 1. Namely, an interlock is set in order to make it impossible to introduce a new lot until the trouble has been solved by taking some measures against the troubled lot. Accordingly, it is impossible to introduce new batches after the alarm is issued. This prevents secondary damages from extending over the following batches.

Once, responding to the issue of the alarm, the trouble is solved by an operator and the alarm is released, the interlock means 100 causes processings of the batches on standby to restart and continue all together with an alarm releasing signal. At that time, if a predetermined water cleaning time has not passed, the batches on standby in the water cleaning baths are kept in the baths until the predetermined water cleaning time has passed, and then the processings of the batches restart and continue for a next processing. If the predetermined water cleaning time has already passed, the processings of the batches on standby immediately restart and continue for the next processing. Also, when the batches stand by in the places behind the drying bath 11, if the predetermined drying time has already passed, the batches are retrieved. If the predetermined drying time has not passed, the batches are retrieved after the predetermined drying time has passed. In this way, the interlock means 100 has an automatic reset function which when a trouble is solved, automatically restarts and continues processings of the following lots on standby.

The content of the interlock has been described up to now as an operation of the semiconductor wafer processing apparatus. According to the present embodiment, however, the above-mentioned content is also presented as a control method of the semiconductor wafer processing apparatus.

As described above, when breakage or missing of the processed wafers has occurred, the present embodiment makes it possible to rapidly or instantaneously detect it and issue an alarm. Also, the present embodiment, based on an interlock operation, exerts no adverse influences on the following or preceding batches, thus making it possible to restrain the damages to a minimum.

Second Embodiment

Figure 4A:
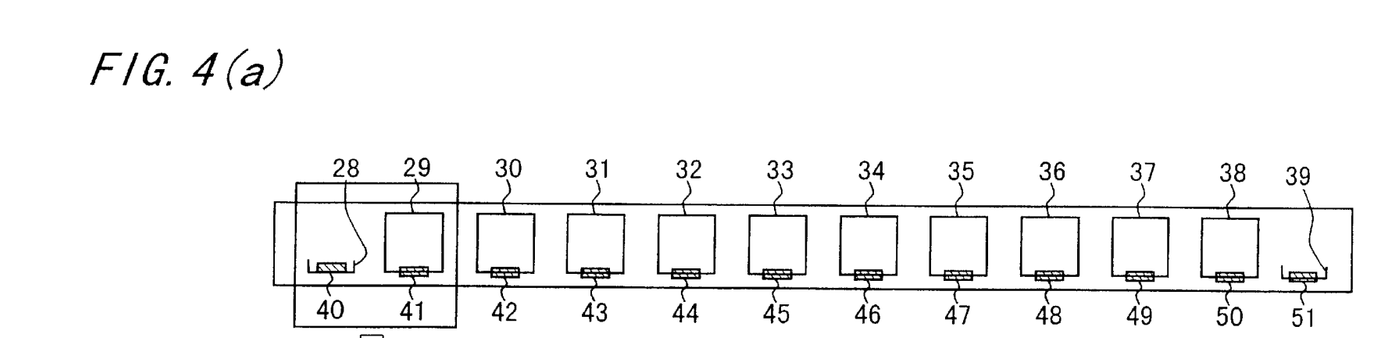
FIG. 4(a) is a diagram showing a state in which a plurality of processing baths are located.
Figure 4B:
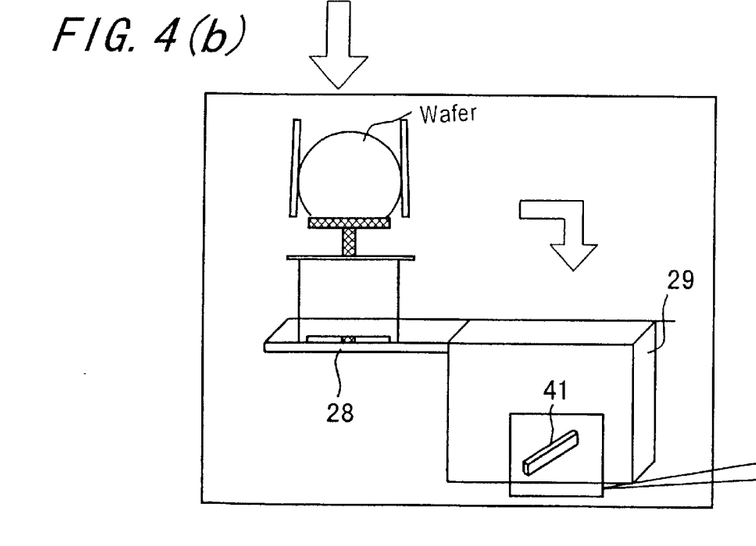
FIG. 4(b) is an enlarged perspective view showing a portion of the processing apparatus in FIG. 4(a).
Figure 4C:
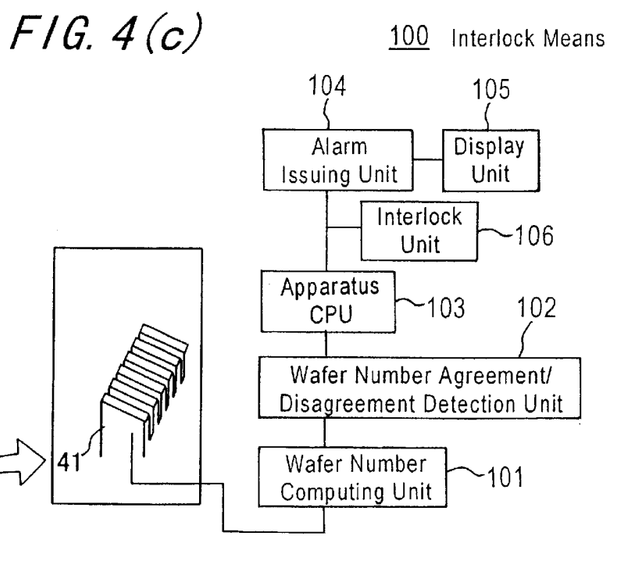
FIG. 4(c) shows an enlarged perspective view showing a portion of the processing bath in FIG. 4(b) and shows a diagram of a constitution of a control means.

FIG. 4 is a diagram showing a constitution of a multibath and batch/dip type semiconductor wafer processing apparatus according to a second embodiment of the present invention. FIG. 4(*a*) is a diagram showing a state in which a plurality of processing baths are located, and FIG. 4(*b*) is an enlarged perspective view showing a portion of the processing apparatus in FIG. 4(*a*). FIG. 4(*c*) shows an enlarged perspective view showing a portion of the processing bath in FIG. 4(*b*), and is a diagram showing a constitution of a control means.

In the semiconductor wafer processing apparatus in FIG. 4, reference numeral 28 designates a loader portion. Numerals 29 through 38 designate processing baths. Among them, numerals 29, 31, 33, and 35 show a first, a second, a third and a fourth chemical processing baths respectively, and numerals 30, 32, 34, 36, 37 show a first, a second, a third, a fourth and a fifth (final) water cleaning baths, and numeral 38 shows an IPA vapor drying bath. Also, numeral 39 designates an unloader portion.

Further, reference numerals 40 through 51 designate wafer counters, two of which are provided at the loader portion 28 and the unloader portion 39 and the others of which are respectively provided inside the processing baths 29 through 38. Among them, numeral 40 shows an introduced wafer counter for counting the number of semiconductor wafers introduced into the loader portion 28, and numerals 41 through 50 show passing wafer counters which respectively count the number of semiconductor wafers processed in the processing baths 29 through 38, and numeral 51 shows a retrieved wafer counter for counting the number of semiconductor wafers retrieved from the unloader portion 39.

FIG. 4(*b*) is an enlarged view showing a portion of both the loader portion 28 and the first chemical processing bath 29 in FIG. 4(*a*). FIG. 4(*b*) shows a state of transportation in which one lot of semiconductor wafers is being transported from the loader portion 28 to the first chemical processing bath 29. In FIG. 4(*b*), reference numeral 41 shows a wafer counter.

Also, FIG. 4(*c*) is a diagram which shows a constitution of an alarm and interlock means 100 as well as schematically shows a structure of the wafer counter 41.

Figure 5A:
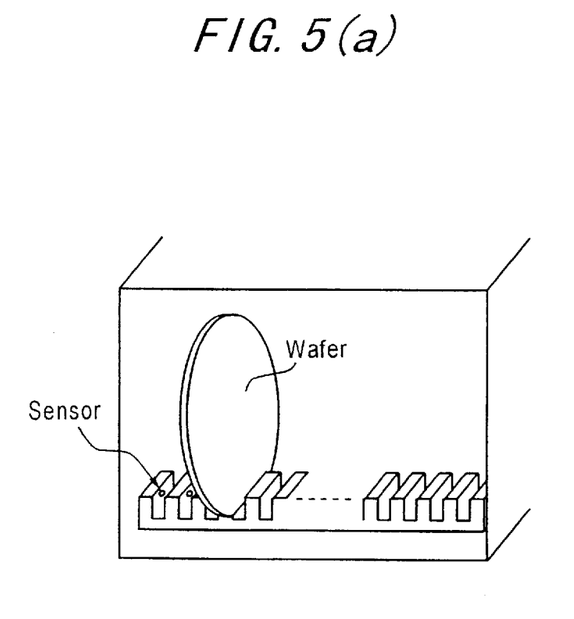
FIG. 5(a) is an enlarged diagram showing a transportation state of semiconductor wafers passing through the wafer counters in the processing apparatus in FIG. 4.

In the second embodiment, the wafer counters 40 and 51 are respectively positioned at the loader portion 28 and the unloader portion 39, and are provided in wafer transporting holders in the processing baths as shown in FIG. 5(*a*). The wafer transporting holders hold semiconductor wafers from a surface plane side thereof, and the wafer counters detect the semiconductor wafers from the plane direction and count the number of the wafers. Concretely, these wafer counters are of a comb-shaped sensor structure.

Figure 5B:
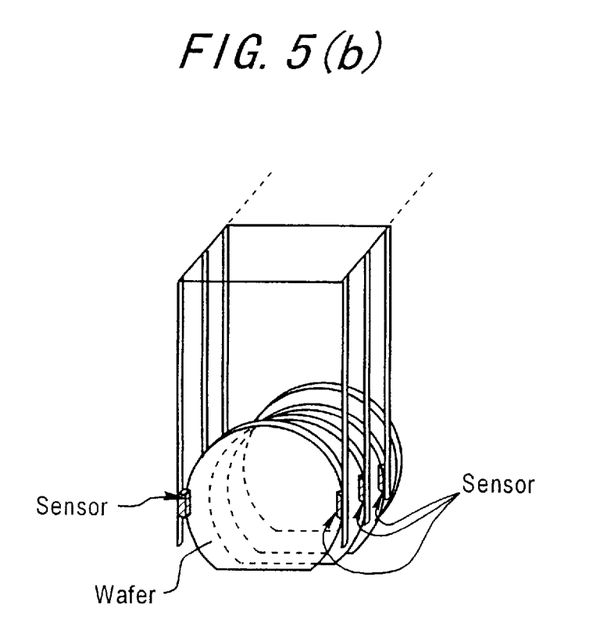
FIG. 5(b) is a diagram showing another structural example of the wafer counters and another example of a transportation state of semiconductor wafers.

Also, the wafer counters 41 through 50 are positioned respectively inside the processing baths 29 through 38, and are provided in wafer transporting arms as shown in FIG. 5(b). The wafer transporting arms hold semiconductor wafers from an external diameter direction thereof, and the wafer counters detect the semiconductor wafers from the external diameter direction and count the number of the wafers. Concretely, these wafer counters have an structure in which sensors are installed at a chucking position in the wafer transporting arms. This makes it possible to count the number of the semiconductor wafers to be introduced or retrieved.

Additionally, since the sensors in the wafer counters 41 through 50 are respectively provided inside the processing baths 29 through 38 such as chemical baths and water cleaning baths, there is a possibility of being corroded by an attachment of the chemicals. In order to prevent this, the sensors are coated with chemical-resistant materials.

If, due to breakage or missing of the wafers, the number of wafers counted by any of the passing wafer counters 41 through 50 or by the retrieved wafer counter 51 differs from the number of wafers counted at the loader portion 28 at the batch introducing time, an alarm and interlock system issues an alarm instantaneously, and at the same time the batch in which the breakage or missing of the wafers has occurred is stopped immediately.

Described concretely below is the operation of the alarm and interlock means 100 shown in FIG. 4(c). The sensors in the wafer counter detect whether or not some semiconductor wafers or substrates are missing. A wafer number computing unit 101 counts the number of the wafers, and a wafer number agreement/disagreement detection unit 102 detects whether or not the number counted agrees with the number counted at the loader portion 28, thus outputting the detection result to an apparatus CPU 103. If the detection result turns out to be in a disagreement, the apparatus CPU 103 outputs an interlock signal to an interlock unit 106, and at the same time outputs an alarm signal to an alarm issuing unit 104. There is also provided a function that when the alarm output is inputted into the alarm issuing unit 104, an alarm is displayed on a display unit 105. This operation is much the same way as in the first embodiment.

Next, the content of the interlock will be described as follows. At a time when a trouble has occurred, the processing are performed as usual and the processed batches are retrieved to the unloader portion 39 for the batches preceding a batch in which the trouble has occurred, i.e. the batches at the side of the unloader portion 39.

On the other hand, as for the batches following the the batch in which the trouble has occurred (i.e. the batches at the side of the loader portion 28), tha batches are set to stand by while being water-cleaned in the next water cleaning bath after the chemical processing under way are over.

Further, when there is furnished a drying bath, a batch in the drying bath is pulled up from the drying bath after having been dried for a predetermined time, and is set to stand by at a standby position before the location at which a trouble has occurred.

Furthermore, it is stopped to introduce new batches after the alarm is issued. This prevents secondary damages from extending over the following batches. The operation stated above is also much the same way as in the first embodiment.

Once, the trouble is solved by an operator and the alarm is released after the issuance of the alarm, processing of the batches on standby restart and continue all together with an alarm releasing signal. At that time, if a predetermined water cleaning time has not passed, the batches on standby in the water cleaning baths are kept in the baths until the predetermined water cleaning time has passed, and then the processings of the batches restart and continue for a next processing. If the predetermined water cleaning time has already passed, the processings of the batches on standby immediately restart and continue for the next processing. Also, when the batches stand by in the locations behind a drying bath, the batches are retrieved if a predetermined drying time has already passed. If the predetermined drying time has not passed, the batches are retrieved after the predetermined drying time has passed. The operation stated above is also much the same way as in the first embodiment.

The content of the interlock has been described above as an operation of the semiconductor wafer processing apparatus. According to the present embodiment, however, the above-mentioned content is construed as a control method of the semiconductor wafer processing apparatus.

As seen from the above, when breakage or missing of the wafers has occurred, the present embodiment makes it possible to issue an alarm instantaneously, thus exerting no adverse influences on the following or preceding batches. This makes it possible to restrain the damages to a minimum.

As described above, the present invention, in a multibath and batch/dip type semiconductor wafer processing apparatus, makes it possible to rapidly or instantaneously detect troubles such as missing or breakage of the wafers. Also, the present invention makes it possible to issue an alarm in correspondence with the detection and set an interlock for the following lots, thereby preventing secondary damages from extending over the following lots. Moreover, the present invention enables the processing to be restarted and continued immediately after the troubles has been solved.

Obviously many modifications and variations of the present invention are possible in the light of the above teachings. It is therefore to be understood that within the scope of the appended claims the invention may by practiced otherwise than as specifically described.

What is claimed is:

1. A semiconductor wafer processing apparatus including a plurality of processing baths for processing semiconductor wafers in sequence on a batch-processing basis, a loader portion for introducing the semiconductor wafers into a first processing bath, and an unloader portion for retrieving the semiconductor wafers from a final processing bath, said processing apparatus comprising:

an introduced wafer counter for counting the number of the semiconductor wafers introduced from said loader portion;

passing wafer counters for counting the number of the semiconductor wafers passing through a number of the processing baths selected from said plurality of processing baths; and a retrieved wafer counter for counting the number of the semiconductor wafers retrieving from said unloader portion.

2. The semiconductor wafer processing apparatus as claimed in claim 1, wherein said introduced wafer counter is provided at said loader portion, and said passing wafer counters are respectively provided between said plurality of passing baths, and said retrieved wafer counter is provided at said unloader portion.

3. The semiconductor wafer processing apparatus as claimed in claim 2,
wherein a plurality of semiconductor wafers are transported on a batch basis in such a manner that the wafers are arranged in sequence in a transportation direction so that planes of the semiconductor wafers are perpendicular to the transportation direction, and said passing wafer counters count the number of the wafers from an external diameter direction of the semiconductor wafers.

4. The semiconductor wafer processing apparatus as claimed in claim 2,
wherein a plurality of semiconductor wafers are transported on a batch basis in such a manner that the wafers are arranged in parallel to a transportation direction so that planes of the semiconductor wafers are parallel to the transportation direction, and said passing wafer counters count the number of the wafers from a plane direction of the semiconductor wafers.

5. The semiconductor wafer processing apparatus as claimed in claim 2,
wherein cleaning means for cleaning said passing wafer counters are provided in proximity to said passing wafer counters.

6. The semiconductor wafer processing apparatus as claimed in claim 1,
wherein said introduced wafer counter is provided at said loader portion, and said passing wafer counters are provided inside said selected processing baths, and said retrieved wafer counter is provided at said unloader portion.

7. The semiconductor wafer processing apparatus as claimed in claim 6,
wherein said passing wafer counters are provided in wafer transporting holders in said plurality of processing baths.

8. The semiconductor wafer processing apparatus as claimed in claim 7,
wherein said wafer transporting holders hold semiconductor wafers from an external diameter direction of the semiconductor wafers, and said passing wafer counters count the number of the wafers from the external diameter direction.

9. The semiconductor wafer processing apparatus as claimed in claim 7,
wherein said wafer transporting holders hold semiconductor wafers from a plane direction of the semiconductor wafers, and said passing wafer counters count the number of the wafers from the plane direction.

10. The semiconductor wafer processing apparatus as claimed in claim 6,
wherein said passing wafer counters are applied with chemical-resistant treatment against semiconductor wafer processing chemicals.

11. The semiconductor wafer processing apparatus as claimed in claim 1,
further comprising an alarming means which issues an alarm when the number of the wafers detected by said passing wafer counters or by said retrieved wafer counter differs from that of the number of the wafers detected by said introduced wafer counter.

12. The semiconductor wafer processing apparatus as claimed in claim 11,
further comprising an interlock means which, when any of said passing wafer counters issues an alarm, stops processing in the corresponding processing bath, and prevents additional lots from being introduced into said loader portion, and stops processing in upstream processing baths after completion of the chemical processing under way, and allows processing in downstream processing baths to continue.

13. The semiconductor wafer processing apparatus as claimed in claim 12,
wherein said interlock means has an automatic reset function which, when a trouble in the processing bath which has issued said alarm is released, automatically continues processing of the following lots on standby.

14. A method of controlling a semiconductor wafer processing apparatus,
said processing apparatus having
a plurality of processing baths for processing semiconductor wafers in sequence in a batch-processing basis,
a loader portion for introducing the semiconductor wafers into a first processing bath,
an unloader portion for retrieving the semiconductor wafers from a final processing bath,
an introduced wafer counter for counting the number of the semiconductor wafers introduced from said loader portion,
passing wafer counters for counting the number of the semiconductor wafers passing through a number of the processing baths selected from said plurality of processing baths, and
a retrieved wafer counter for retrieving from said unloader portion,
said method comprising the steps of:
issuing an alarm, when the number of the wafer detected by said passing wafer counters or by said retrieved wafer counter differs from the number of the wafers detected by said introduced wafer counter;
stopping processing in the corresponding processing bath;
preventing additional lots from being introduced into said loader portion;
stopping processing in upstream processing baths after the completion of the chemical processing under way; and
allowing processing in downstream processing baths to continue.

15. The method of controlling a semiconductor wafer processing apparatus as claimed in claim 14, further comprising a step of:
automatically continuing processing of the following lots on standby when a trouble in the processing bath corresponding to said alarm is released.

16. A method of processing a semiconductor wafer by using the semiconductor wafer processing apparatus as defined in claim 1, the method comprising:
introducing a batch of semiconductor wafers into the first processing bath;
passing a number of the semiconductor wafers through a predetermined number of said processing baths; and
retrieving the number of semiconductor wafers from said unloader portion.

17. A method of processing a semiconductor wafer by using the semiconductor wafer processing apparatus as defined in claim 2, the method comprising:

determining missing or breakage of the semiconductor wafers has happened when the number of the wafers detected by said retrieved wafer counter differs from that of the number of the wafers detected by said introduced wafer counter.

18. A method of processing a semiconductor wafer by using the semiconductor wafer processing apparatus as defined in claim 6, the method comprising:

determining missing or breakage of the semiconductor wafers has happened when the number of the wafers detected by said retrieved wafer counter differs from that of the number of the wafers detected by said introduced wafer counter.

19. A method of processing a semiconductor wafer by using the semiconductor wafer processing apparatus as defined in claim 11, the method comprising:

issuing an alarm, when the number of the wafers detected by said retrieved wafer counter differs from that of the number of the wafers detected by said introduced wafer counter.

\* \* \* \* \*